United States Patent
Zhang et al.

(10) Patent No.: US 10,811,101 B2
(45) Date of Patent: *Oct. 20, 2020

(54) APPARATUSES AND METHODS FOR TRANSISTOR PROTECTION BY CHARGE SHARING

(71) Applicant: MICRON TECHNOLOGY, INC., Boise, ID (US)

(72) Inventors: Yafeng Zhang, Shanghai (CN); Liang Qiao, Shanghai (CN); Chunyuan Hou, Shanghai (CN); Jun Xu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/537,345

(22) Filed: Aug. 9, 2019

(65) Prior Publication Data

US 2019/0362793 A1 Nov. 28, 2019

Related U.S. Application Data

(60) Continuation of application No. 15/841,107, filed on Dec. 13, 2017, now Pat. No. 10,381,087, which is a division of application No. 14/430,448, filed as application No. PCT/CN2015/072095 on Feb. 2, 2015, now Pat. No. 9,865,355.

(51) Int. Cl.
*G11C 16/22* (2006.01)
*G11C 16/14* (2006.01)
*G11C 16/30* (2006.01)

(52) U.S. Cl.
CPC ............ *G11C 16/225* (2013.01); *G11C 16/14* (2013.01); *G11C 16/30* (2013.01)

(58) Field of Classification Search
CPC ........ G11C 16/225; G11C 16/14; G11C 16/30
USPC ....................................... 365/185.29
See application file for complete search history.

(56) References Cited

U.S. PATENT DOCUMENTS

| | | | |
|---|---|---|---|
| 8,009,494 B2 | 8/2011 | Chang | |
| 8,837,188 B1 | 9/2014 | Krishnamurthy et al. | |
| 9,111,600 B2 | 8/2015 | Wang et al. | |
| 9,336,890 B1 | 5/2016 | Mori | |

(Continued)

FOREIGN PATENT DOCUMENTS

| | | |
|---|---|---|
| CN | 101359454 A | 2/2009 |
| JP | S60189325 A | 9/1985 |
| WO | 2016123731 A1 | 8/2016 |

OTHER PUBLICATIONS

International Search Report and Written Opinion dated Aug. 31, 2015 received for PCT/CN2015/072095, 12 pgs.

(Continued)

*Primary Examiner* — Fernando Hidalgo
(74) *Attorney, Agent, or Firm* — Dorsey & Whitney LLP

(57) ABSTRACT

Apparatuses and methods for protecting transistors through charge sharing are disclosed herein. An example apparatus includes a transistor comprising a gate node and a bulk node, a charge sharing circuit coupled between the gate and bulk nodes, and logic. The charge sharing circuit is configure to equalize charge differences between the gate and bulk nodes, and the logic is configured to enable the charge sharing circuit based at least in part on a combination of first and second signals, which indicate the presence of a condition.

19 Claims, 8 Drawing Sheets

(56) References Cited

U.S. PATENT DOCUMENTS

| | | |
|---|---|---|
| 9,450,402 B1 | 9/2016 | Huang et al. |
| 9,576,679 B2 | 2/2017 | Powell et al. |
| 9,865,355 B2 | 1/2018 | Zhang et al. |
| 10,381,087 B2 | 8/2019 | Zhang et al. |
| 2007/0025164 A1 | 2/2007 | Kim et al. |
| 2009/0154252 A1* | 6/2009 | Shibata .............. G11C 16/10 365/185.22 |
| 2011/0026349 A1* | 2/2011 | Kim .................... G11C 7/04 365/212 |
| 2013/0055189 A1 | 2/2013 | Nomura et al. |
| 2013/0346836 A1* | 12/2013 | Song .................. G06F 11/10 714/800 |
| 2014/0003181 A1* | 1/2014 | Wang .................. G11C 11/413 365/226 |
| 2014/0337539 A1 | 11/2014 | Lee et al. |
| 2017/0140830 A1 | 5/2017 | Zhang et al. |
| 2018/0108420 A1 | 4/2018 | Zhang et al. |

OTHER PUBLICATIONS

U.S. Appl. No. 15/841,107 entitled "Apparatuses and Methods for Transistor Protection by Charge Sharing" filed Dec. 13, 2017, pp. all.

* cited by examiner

APPARATUSES AND METHODS FOR TRANSISTOR PROTECTION BY CHARGE SHARING

CROSS REFERENCE TO RELATED APPLICATION(S)

This application is a continuation of U.S. patent application Ser. No. 15/841,107 filed Dec. 13, 2017 and issued as U.S. Pat. No. 10,381,087 on Aug. 13, 2019, which is a Divisional of U.S. patent application Ser. No. 14/430,448 filed Mar. 23, 2015 and issued as U.S. Pat. No. 9,865,355 on Jan. 9, 2018, which is a 371 National Stage Filing of International Application No. PCT/CN2015/072095 filed Feb. 2, 2015. The aforementioned applications, and issued patent, are incorporated herein by reference, in their entirety, for any purpose.

BACKGROUND

Conventional FLASH memory may operate in various operating modes, such as erase, program, and read. During each of these operating modes, the storage cells of the FLASH memory, along with supporting logic, may experience different operating conditions (e.g., voltage levels) associated with each mode. While in one or more of the operating modes, the memory may experience unexpected and unwanted transient conditions that may alter the performance of the memory and/or ultimately cause damage to one or more internal components. The damage, in the worst case, may render the memory inoperable. For example, if a FLASH memory experiences power loss while performing an erase operation, the operating voltages applied to various transistors within the memory may experience permanent physical damage, which may lead to device inoperability. Other similar conditions may also arise that may lead to similar failures in face of a power loss or transient voltage spike, for example, occurring concurrently with the performance of an operation. As such, it may be desirable to detect the occurrence of such conditions and reduce or prevent damage to the memory.

SUMMARY

Examples of the disclosure may include a charge sharing circuit and logic for establishing a charge sharing path between nodes of one or more transistors. For example, a charge sharing circuit may be coupled between gate and bulk nodes of a transistor, and the charge sharing circuit is configured to equalize charge difference between the gate and bulk nodes. Logic, which may be coupled to the charge sharing circuit, may be configured to enable the charge sharing circuit based at least in part on a combination of first and second signals, wherein the first and second signals are indicative of a condition.

Examples of the disclosure may include a method of establishing a charge sharing path based on the occurrence of a condition. For example, a method may include monitoring for the occurrence of a condition, and, based on the occurrence of the condition, coupling a gate node and a bulk node of a transistor and de-coupling the gate node and the bulk node from first and second voltages, respectively. The condition may include the loss of power during an erase operation.

Examples of the disclosure may include a control circuit configured to couple nodes of one or more transistor based on the occurrence of a condition. For example, the control circuit may be configured to control coupling of a gate and bulk nodes of a transistor based on the occurrence of a condition. The control circuit may be further configured to detect the occurrence of the condition. Additionally, a charge sharing circuit may be coupled between the gate and bulk nodes of the transistor and configured to couple the gate and bulk nodes together based on a control signal provided by the control circuit.

Examples of the disclosure may include a method of enabling a charge sharing circuit based on the occurrence of a condition. For example, the method may include providing a high negative voltage to a gate node of a transistor during a first operational mode of a memory, and providing a high positive voltage to a bulk node of the transistor during the first operation mode of the memory. The method may further include enabling a charge sharing circuit between the gate and bulk nodes of the transistor responsive to a control signal, the control signal based at least in part on the occurrence of the condition.

DETAILED DESCRIPTION

Apparatuses and methods for protecting transistors through charge sharing are disclosed herein. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
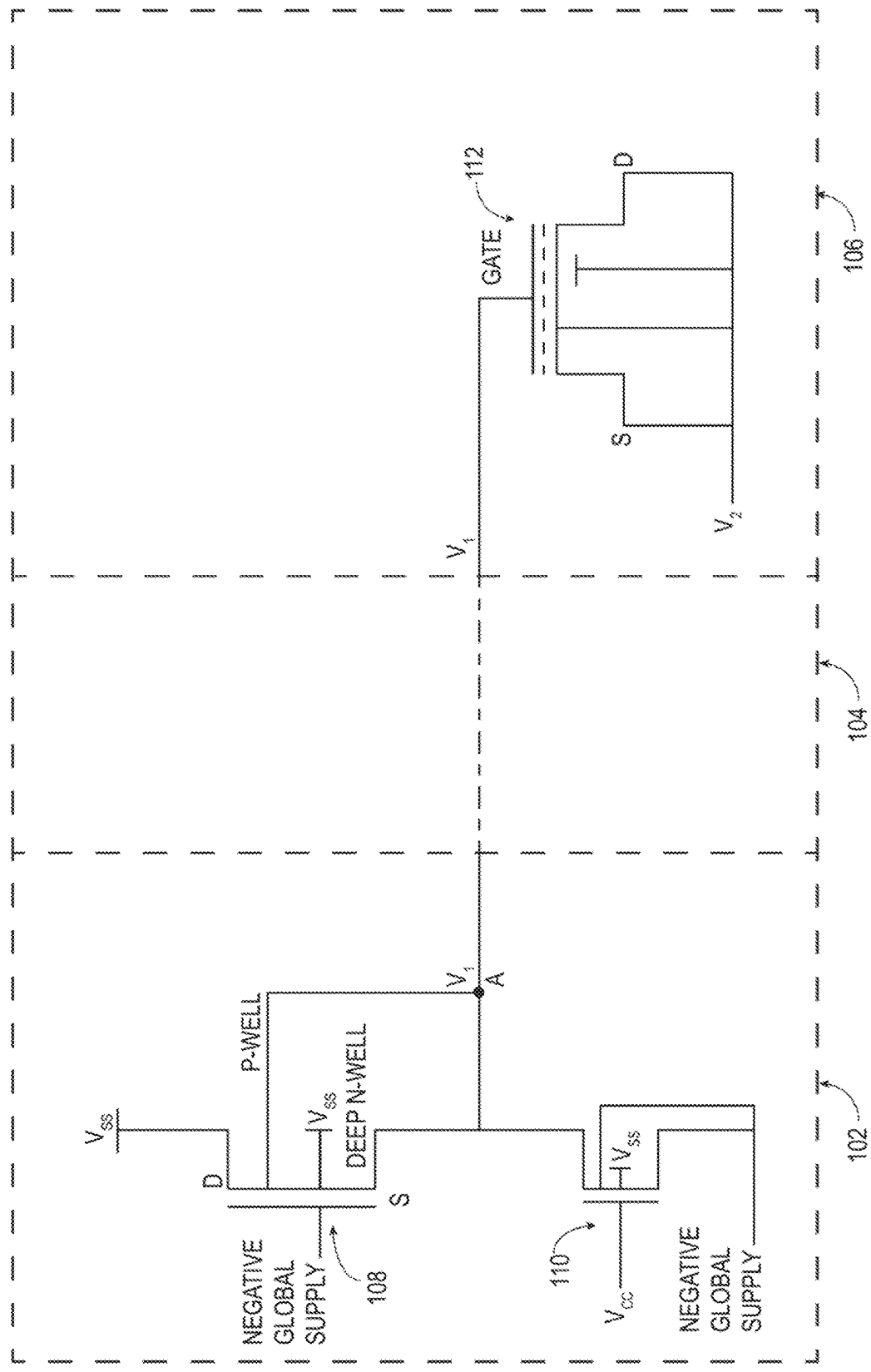
FIG. 1 is a block diagram of an apparatus according to an embodiment of the present disclosure.

FIG. 1 is a block diagram of an apparatus 100 (e.g., an integrated circuit, a memory device, a memory system, an electronic device or system, a smart phone, a tablet, a computer, a server, etc.) according to an embodiment of the present disclosure. The apparatus 100 may include an access line voltage generator 102, an access line driver 104, and a memory array 106. The access line voltage generator 102 may generate voltages of various levels dependent upon an operational mode of the apparatus 100 (e.g., program, erase, read, etc.) and provide the voltages to the access line driver 104. The access line voltage generator 102, for example, may generate the voltages by level shifting the voltages from a base voltage, or operating voltage, of the apparatus 100.

For example, global supply voltages may be the basis for generating the various voltages, such as a supply voltage $V_{cc}$, a programming voltage, an erase voltage, etc. The access line driver 104 may provide the voltages to various blocks or individual memory cells of the memory array 106 via access lines, the access lines may be word lines, for example. The access lines may be individually addressable or may be addressed in blocks of cells and the cells addressed may depend on an address received by the apparatus 100, from a memory controller for example. The apparatus 100 may be included, for example, in a memory such as volatile and non-volatile memory, a synchronous random access memory (SRAM), dynamic RAM (DRAM), FLASH (both NAND and NOR), or the apparatus 100 may represent a portion of such a memory.

During operation, the apparatus 100 may experience various unexpected conditions. An unexpected condition may be based on the characteristics of one of the operational modes and an unplanned/undesired voltage/current occurrence, e.g., loss of power, voltage spikes, and/or voltage/current transients. Such unexpected conditions may undesirably damage various components of the apparatus 100, such as the access line voltage generator 102. For example, an operational mode of the apparatus 100 may result in the application of high voltages, both positive and negative, to various of transistors included in the apparatus 100, such as transistors in the access line voltage generator 102 and transistors in the memory array 106. To further illustrate, during an erase operation, the access line voltage generator 102 may be providing a large negative voltage to the memory array 106, which may be applied to gates of memory cell transistors. The memory cell transistors may also receive a large positive voltage on their source, drain, and bulk nodes to implement the erase operation. If, however, a power loss occurs while the high positive and negative voltages are applied to the memory cell transistors, transistors in the access line voltage generator 102 may be damaged. This damage may result in the apparatus 100 becoming inoperable. Damage to the various components of the apparatus 100 may also occur during or after a program operation, as well.

To further illustrate, one or more transistors included in the access line voltage generator 102, such as transistors 108 and 110, may be providing a high negative voltage, V1, to a block of transistors, e.g., memory cells, in the memory array 106. The high negative voltage may be applied through access lines to the gates of the transistors in the memory cells. In this illustration, the access line driver 104 may be operating as a pass gate and may be connecting the transistors 108 and 110 to the block of transistors if the memory array 106. The transistors in the memory array 106, as represented by transistor 112, may then experience a high negative voltage V1 applied to a gate node while a large positive voltage V2 is applied to source, drain, and bulk nodes of the transistors. The voltages V1 and V2 may be generated from positive and negative global supply voltages supplied to the apparatus 100. The positive global supply voltage, which may be the basis of V2, is not shown in FIG. 1. The bulk node may be comprised of a p-well node and a deep n-well node. In some embodiments, a bulk node may be referred to as comprising the p-well, deep n-well, source, and drain nodes. This operational mode, for example, may be an erase operation the apparatus 100 is performing on a block of memory cells of the memory array 106. During performance of the erase operation, the apparatus 100 may lose power, which may occur for any number of reasons. The occurrence of the loss of power during, or directly after, the erase cycle may create a relatively high voltage differential across the transistor 112, which may result in damage to at least transistor 108 of the access line voltage generator 102. As a result, the access line voltage generator 102 may cease to operate as designed.

The potential damage to transistor 108 may be due to several factors. These factors may include how the positive voltage on the bulk node of the transistor 112 decays relative to the negative voltage on the gate of the transistor 112, the number of memory array 106 transistors in a block, and the relative voltages on the various nodes of the transistor 108. These factors may combine to cause damage to the transistor 106 if a power loss occurs while the voltages applied during an erase operation are still present on the various transistors depicted in FIG. 1. For illustration, during an erase operation, V1 may be −12 volts and V2 may be +10 volts. As such, based on the depiction in FIG. 1, V1 may be applied to the gate node of the transistor 112 through an access line at least including node A, the gate node, source node, and bulk node of the transistor 108. V2 may be applied to the source, drain, and bulk node (e.g., p-well, and deep n-well) of the transistor 112. An erase operation, as noted, may be performed on a block of memory cells within the memory array 106, such that, for example, a million memory cells are erased. Due to the block erase, there may be a million transistors 112 coupled together and to the transistor 108 through node A. If a power loss occurs, the drain, source, p-well and deep n-well voltages of the transistor 112 may quickly decay to zero. However, the voltage on the gate node of transistor 112 may decay more slowly. Further, due to capacitive coupling between the gate node of transistor 112 and the source, drain, and bulk nodes of transistor 112, the gate node of transistor 112 may be pulled to an even lower negative voltage, −14 volts for example. Since the block of transistors of the memory array may be pulled down to −14 volts, the voltage at node A is also pulled down to −14 volts. This large negative voltage at node A may also be present on the bulk node of the transistor 108. However, since the drain of transistor 108 is coupled to Vss, which may be ground, a voltage difference across a p-n junction between the p-well and the drain may be larger than the breakdown voltage of that p-n junction, which may be damaged as a result.

One solution to reduce or eliminate this failure mechanism may be to establish a charge sharing path to reduce a high negative voltage across one or more transistors of the access line voltage generator 102. For example, a charge sharing circuit coupled between a gate node and a bulk node of certain transistors included in the memory array 106, for example, may be configured to reduce or eliminate such a failure mechanism. The charge sharing circuit may reduce the incidence of destructive voltages from being established within one or more transistors of the access line voltage generator 102, which may still be coupled to the memory array 106 after the charge sharing path is established.

The charge sharing circuit may include switches to establish the circuit based on the occurrence of the condition (e.g., the loss of power while a high negative voltage is applied to a gate node of a transistor and high positive voltages are applied to source, bulk, and drain nodes of the transistor). For example, when a power failure signal occurs while, or directly after, the memory is performing an erase operation, the combination of the two representative signals may control a plurality of switches to establish the charge sharing circuit. The enablement of the charge sharing path may couple a gate to the body of one or more transistors in the memory array 106, e.g., memory cells, to avoid the establishment of a large reverse bias across p-n junctions of the one or more transistors of the access line voltage generator 102, which may physically damage the p-n junction. Further, the charge sharing path may decouple the one or more transistors of the memory array 106 from supply voltages, one of which may be provided by the access line voltage generator 102. A node of the access line voltage generator 102 supplying the supply voltage may be placed in a floating state, e.g., not tied to a source or a ground, and the voltage of the floating node may reduce or eliminate the failure mechanism. The enablement of the charge sharing path may equalize charge differences between two sides of the p-n junction, between a gate node and a bulk node of a transistor. In other embodiments, the power failure signal described above may be substituted by an end of operation signal, e.g., at the end of an erase operation, and node discharge may occur under the control of the charge sharing circuit.

Figure 2:
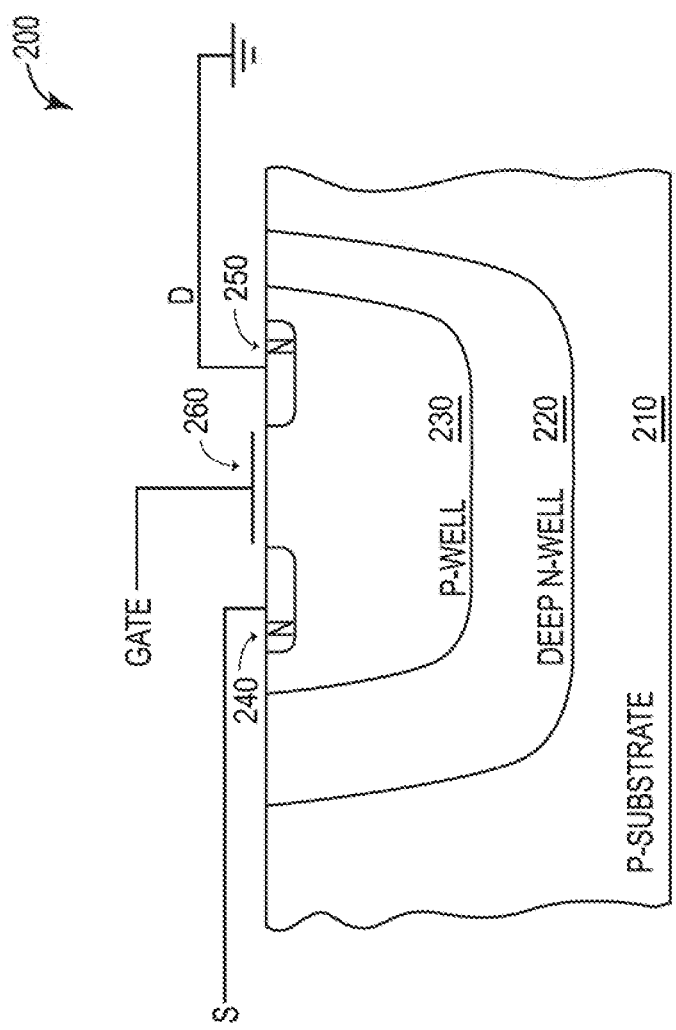
FIG. 2 illustrates a cross-sectional view of a transistor in accordance with an embodiment of the present disclosure.

FIG. 2 illustrates a cross-sectional view of a transistor 200 in accordance with an embodiment of the present disclosure, which may be used to illustrate the destructive mechanism discussed above. The transistor 200 may, for example, represent a transistor included in the access line voltage generator 102 of FIG. 1, such as the transistor 108 for example. The transistor 200 depicted in the cross-sectional view may be manufactured in a p-type substrate 210 and may include such nodes/layers as a deep n-well 220, a p-well 230, a source 240, a drain 250, and a gate 260. The deep n-well 220 and the p-well 230 nodes may collectively be referred to as a bulk node, but they may however be individually accessed during the operation of the transistor depending on the operational mode. The various layers shown in the cross-sectional view may be manufactured by any known means (e.g., ion implantation, epitaxial growth or regrowth, diffusion, etc.) and the processing of the depicted layers is a non-limiting aspect of the present disclosure. Additionally, the cross-sectional view is for illustrative purposes only and one skilled in the art would recognize other structures that would fall within the scope of the present disclosure.

During operation of the access line voltage generator 102, for example, the representative transistor 200 may have various voltage levels coupled to and/or supplied by one or more of the nodes shown in FIG. 2. For example, during an erase operation the gate node 260 may be coupled to negative (−) 12 volts, which may be provided by source 240, and p-well 230. The drain and deep n-well 220 nodes may be coupled to ground. The node A may be coupled to the source 240 and p-well 230, and may also be coupled to an access line. The high negative voltage associated with the gate 260 may also be applied to an access line at node A that is coupled to memory cells of the memory 106 via the access line driver 104, for example. The voltage provided to the memory array 106 by the access line voltage generator 102 and the access line driver 104 may provide voltages to a block of addressed memory cells to perform the erase operation. If, however, there is a power loss during the erase operation, the voltages applied to the various nodes of the transistor 200 may decay to zero at various rates. The difference in decay time may result in damage to the representative transistor 200.

The difference in decay times may be due to capacitive coupling of the various nodes of the transistor 200 to the other nodes of the transistor. This coupling may cause unexpected voltage increases within the transistor 200 that may lead to physically damaging one or more internal p-n junctions. Due to the node A being coupled to a block of memory cells through an access line, the voltage on node A may experience a negative voltage spike, which may be applied to p-well 230. The negative voltage spike may cause the voltage on node A to decrease to negative 14 volts, for example. A negative voltage on the p-well 240 and the drain 250 being at ground, a large reverse bias may form across the p-n junction between the p-well 230 and the drain 250. The large reverse bias may be larger than the breakdown voltage of the particular junction. This large reverse bias may result in thermal runaway leading to physical damage of the p-n junction. The damage to the p-n junction may result in the junction becoming essentially a short circuit. Ultimately, the access line voltage generator 102 may be unable to perform subsequent erase operations.

Figure 3:
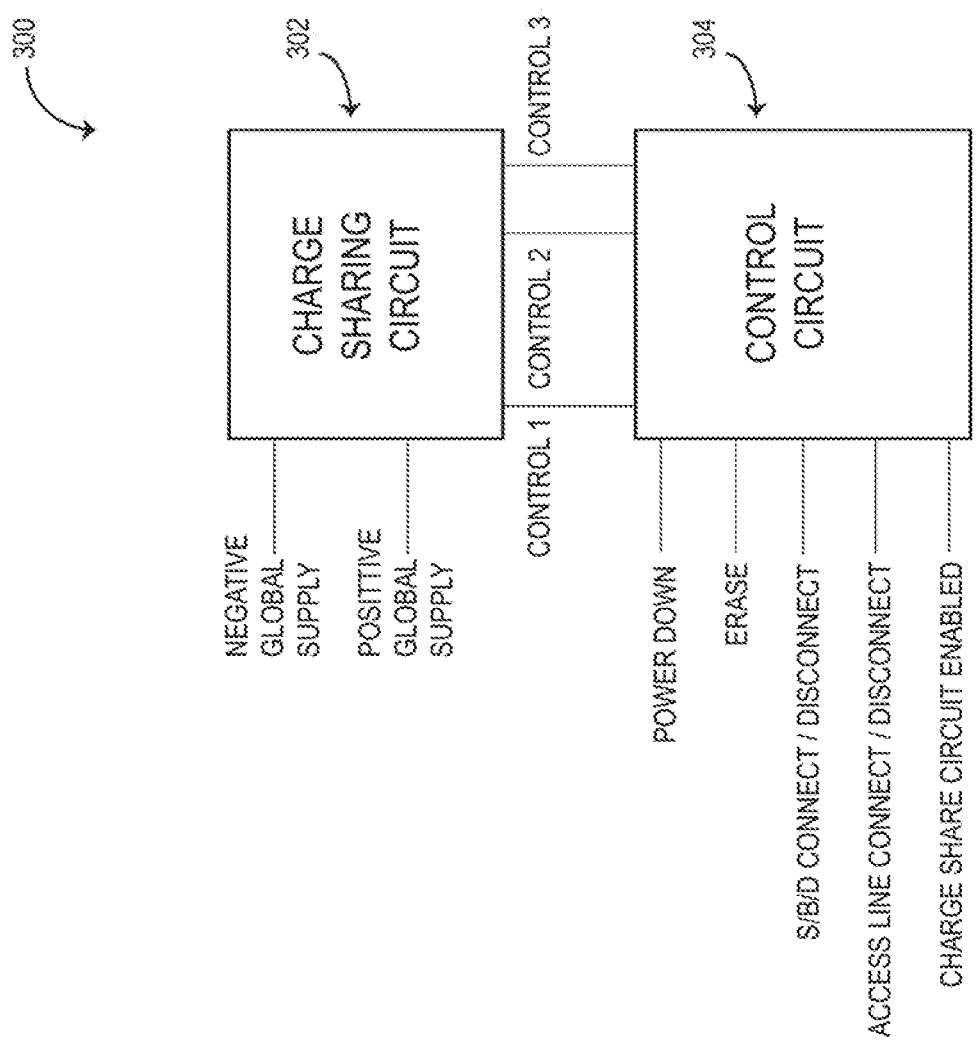
FIG. 3 is a block diagram of charge equalization circuit in accordance with an embodiment of the present disclosure.

FIG. 3 is a block diagram of a charge equalization circuit 300 in accordance with an embodiment of the present disclosure. The circuit 300 may be part of a memory device, a NOR flash memory for example, and may include a charge sharing circuit 302 and a control circuit 304. The control circuit 304 may monitor for the occurrence of a condition such as the occurrence of a power failure while an erase operation is being performed, for example. Another example condition may be the loss of power directly after an erase condition has completed but before the voltages applied during the erase operation have been changed or dissipated. Upon the occurrence of the condition, the control circuit 304 may enable the charge sharing circuit 302 by placing various logic levels onto control lines 1, 2, and 3. The enablement of the charge sharing circuit 302 may disconnect one or more memory array transistors, and at least an access line voltage generator, coupled to the charge sharing circuit 302 from the positive and negative global supply voltages. Additionally, the charge sharing circuit 302 may establish a charge sharing path between gate nodes of the one or more memory array transistors and bulk nodes of the one or more memory array transistors. The memory array transistors, however, may still be coupled to an access line voltage generator after the global supply voltages have been decoupled and the charge sharing path has been established. The establishment of the charge sharing path may result in charge at both the gate nodes and the bulk nodes equalizing. Further, disconnecting the global supply voltages from the one or more memory array transistors may prevent nodes of one or more access line voltage generator transistors from being pulled below an erase voltage, such as −12 volts for example. Preventing nodes of the one or more access line voltage generator transistors from being pulled below the erase voltage may reduce or eliminate damage from occurring at a p-n junction between their respective p-wells and drains.

The control circuit 304 may include various logic gates and devices that may receive various control and status signals of the device incorporating the charge equalization circuit 300. The occurrence of the condition may cause the control circuit 304 to establish the charge sharing path and de-couple the charge sharing circuit 302 from the voltage sources V1 and V2. The charge sharing circuit 302 may include various switches, e.g., transistors, which may de-couple the voltage sources and establish the charge sharing path based on a state of the three control signals.

Figure 4A:
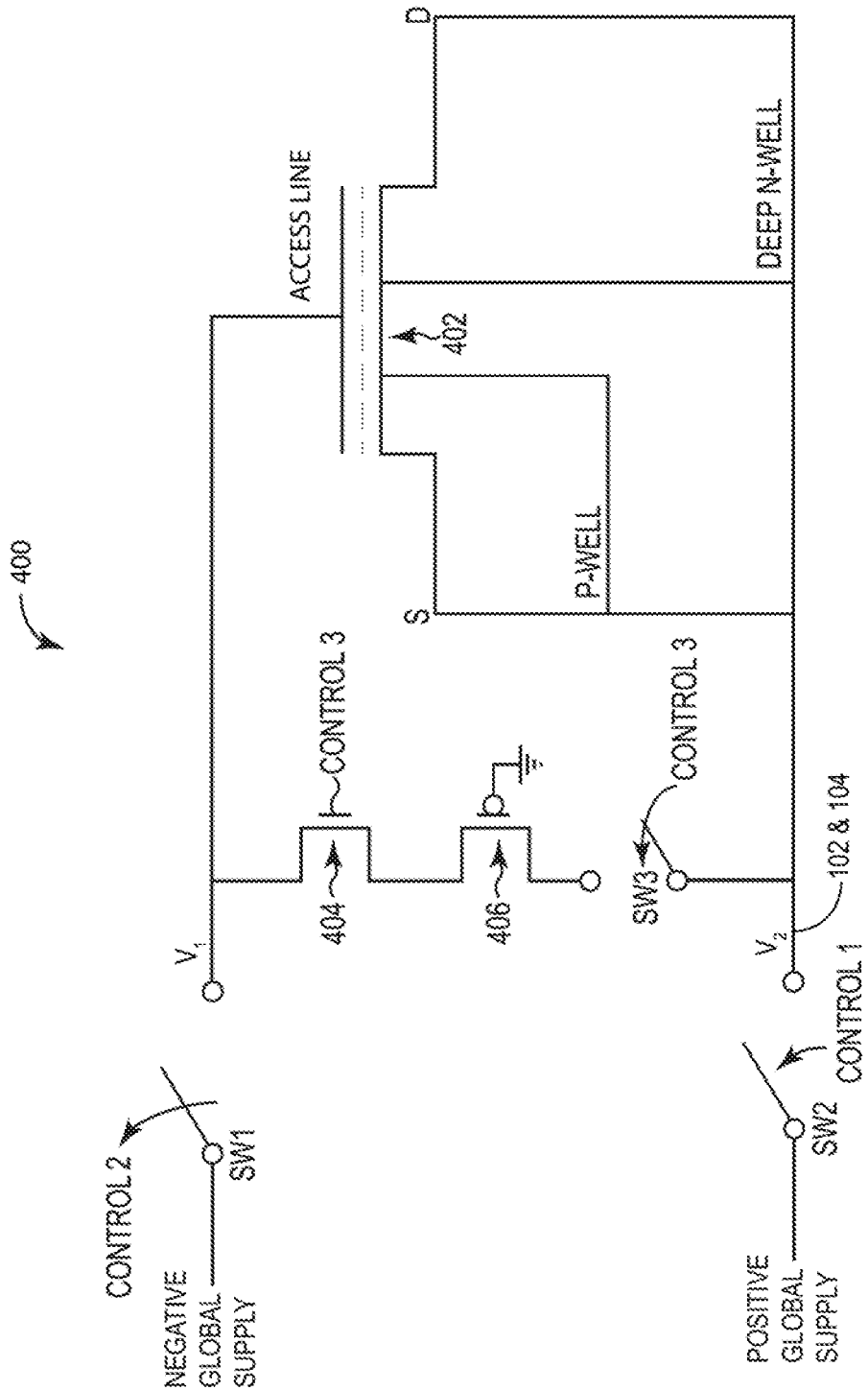
FIG. 4A is an example charge sharing circuit in accordance with an embodiment of the present disclosure.

FIG. 4A is an example charge sharing circuit 400 in accordance with an embodiment of the present disclosure. The charge sharing circuit 400 may be used for the charge sharing circuit 302 of FIG. 3, for example, and may be configured to establish a charge sharing path between gate nodes and sour, drain, p-well, and deep n-well nodes of one or more memory array transistors as represented by transistor 402. The charge sharing circuit 400 may be coupled to a transistor 402 and both the transistor 402 and the charge sharing circuit may be included in a NOR flash memory. The transistor 402 may represent transistors of a memory array, such as the memory array 106 of FIG. 1. The charge sharing path 400 may be included in a memory array, for example, and the voltages V and V2 may be provided by an access line voltage generator (not shown), for example. The voltages V1 and V2 may be based on negative and positive global supply voltages, respectively, which may be provided by a host. The voltages V1 and V2 may be provided to the transistor 402 for performing various operations, such as programming and erasing operations.

The charge sharing circuit 400 may include an n-channel transistor 404, a p-channel transistor 406 and a switch SW3, with the combination of the transistors 404, 406 and the switch SW3 configured to couple the gate node of the transistor 402 to the bulk node and the source and drain nodes of the transistor 402. The n-channel transistor 404 may be a current limiting transistor configured to slowly increase current through the charge sharing circuit for charge dissipation. The charge sharing circuit may further include a switch SW1 and a switch SW2 which may disconnect the gate node and the source, bulk, and drain nodes of the transistor 402 from global supply voltages. The control of the three switches SW1, 2, and 3 and the n-channel transistor 404 will be described in conjunction with FIG. 5A.

Figure 4B:
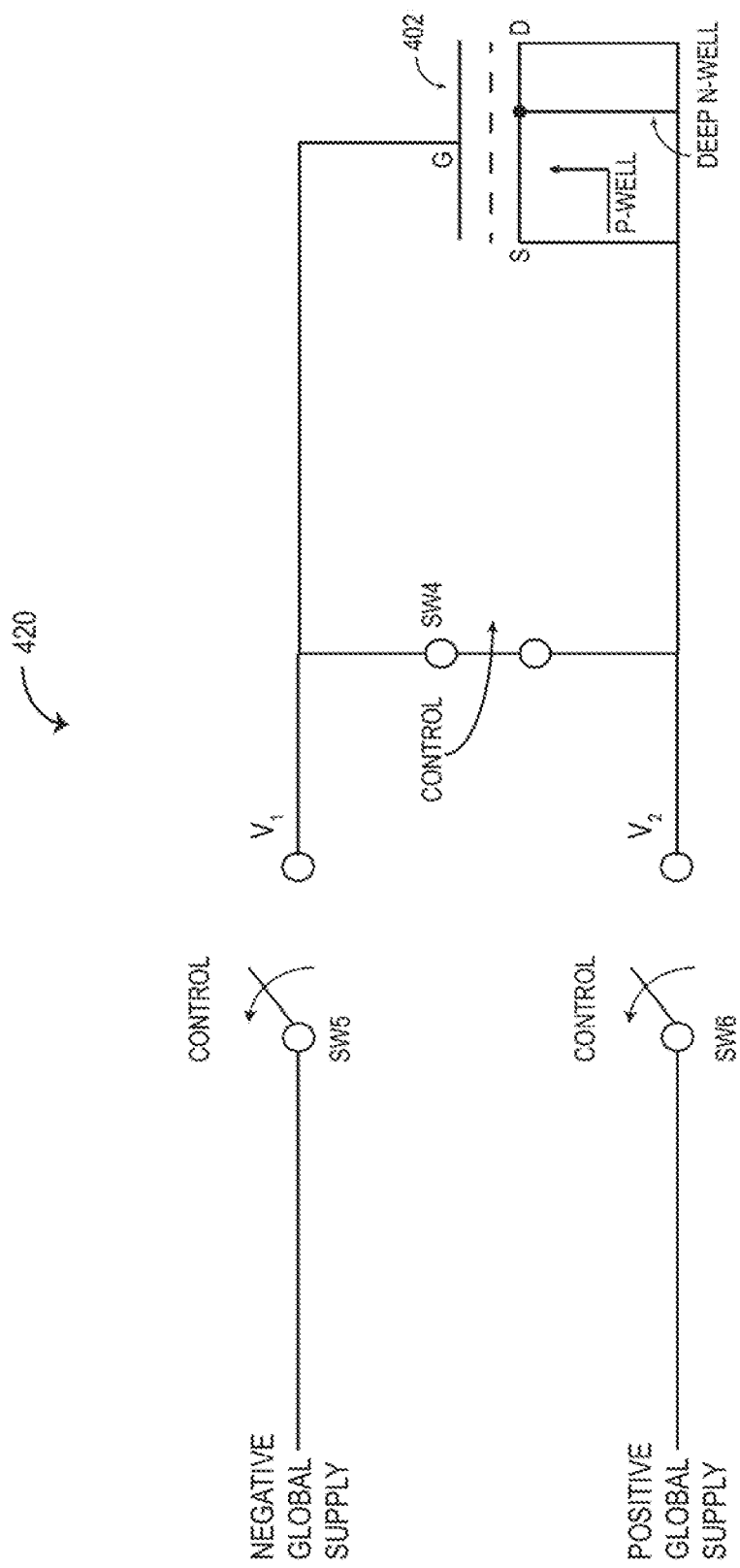
FIG. 4B is an example of a charge sharing circuit in accordance with an embodiment of the present disclosure.

FIG. 4B is an example of a charge sharing circuit 420 in accordance with an embodiment of the present disclosure. The charge sharing circuit 420, which may include switches SW4, 5, and 6, may be configured to establish a charge sharing path between a gate node and the source, drain, p-well, and deep n-well nodes of the transistor 402 base on one or more control signals. For example, the switch SW4 may close and the switches SW 5 and 6 may open when one or more control signals are received. The control signals, for example, may be provided by a control circuit, such as the control circuit 304 of FIG. 3. The control of the switches SW 4, 5, and 6 will be further described in conjunction with FIG. 5B.

Figure 5A:
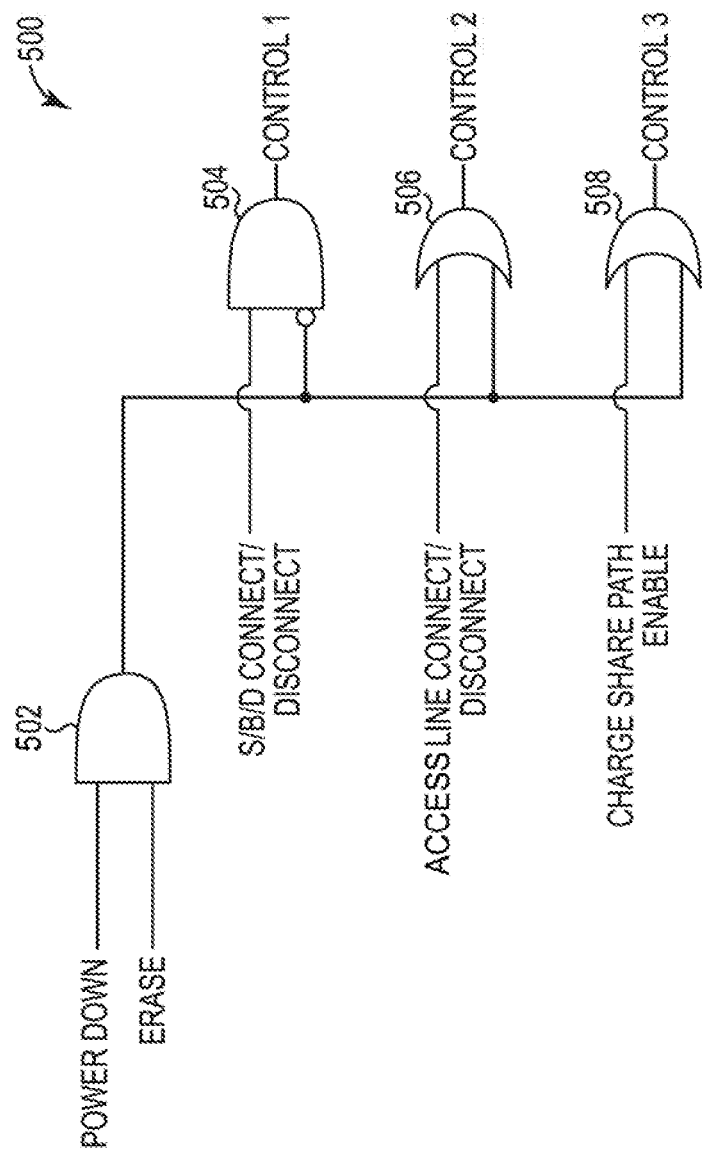
FIG. 5A is an example control circuit in accordance with an embodiment of the present disclosure.

FIG. 5A is an example control circuit 500 in accordance with an embodiment of the present disclosure. Control circuit 500 may receive a plurality of signals and, based on logic combinations of those signals, may provide control signals to a charge sharing circuit, such as the charge sharing circuit 400 of FIG. 4. The control circuit 500 may receive various signals indicative of an operation being performed by a memory, for example, or of a state of various components of the charge sharing circuit. The received signals may include a power down signal, an erase mode signal, a charge share circuit enable signal, an access line connect/disconnect signal, and a source/bulk/drain connect/disconnect signal. The power down signal may transition to a high logic level, for example, when a loss of power occurs. The erase signal may be in a high logic level, for example, when an erase operation is being performed by a memory, a memory that may be or include the apparatus 100 of FIG. 1 for example.

The control circuit 500 may include an AND gate 502 configured to receive at an input a signal indicating an erase operation is currently being performed by a memory, for example, such as the apparatus 100 of FIG. 1. The AND gate 502 may also be configured to receive at another input signals indicating a power loss, for example. An output of the AND gate 502 may be provided to other logic of the control circuit 500, such as an AND gate 504, an OR gate 506, and an OR gate 508. The output of the AND gate 502 may indicate the occurrence of an unwanted condition, such as a loss of power while an erase operation is being executed or has just completed execution, for example. Other conditions that may also result in damaging transistors may similarly be monitored for and detected. Further, the output of the AND gate 502 may initiate control signals to operate the various switches of the charge sharing circuit 400 of FIG. 4.

The control circuit may additionally include the AND gate 504 which may be configured to receive the output of the AND gate 502 and a signal for triggering the switch SW2 (the signal S/B/D connect/disconnect), which may connect and disconnect the source, p-well, deep n-well, and drain node from the voltage source V2. Also potentially included in the control circuit 500 is the OR gate 506 which may be configured to receive the output of the AND gate 502 and a signal for triggering the switch SW1 (the access line connect/disconnect), which may connect and disconnect the gate node/access line from the voltage source V1. Further included in the control circuit 500 may be the OR gate 508 which may be configured to receive the output of the AND gate 502 and a signal for triggering the switch SW3 (the charge share circuit enable), which may close the charge sharing circuit 400 and couple the gate node to the source/bulk/drain nodes of the transistor 402. The output of the OR gate 508 may also turn on the transistor 404 so that current begins to flow through the charge share circuit 400. The configuration of the control circuit 500 is for illustrative purposes only and one skilled in the art would appreciate the multitude of designs that may be employed to implement like function. Any such design would fall within the scope of the current disclosure. The other signals may be used to control the various switches included in the charge sharing circuit 400, for example. Operation of the control circuit 500 and how it controls the charge sharing circuit 400 will now be described.

During an erase operation the erase signal provided to the AND gate 502 may be at a high logic level. If power is lost during the erase operation, then the power down signal may transition to the high logic level causing an output of the AND gate 502 to transition to the high logic level. The output of the AND gate 502 may in turn affect the outputs of the AND gate 504 and the OR gates 506, 508. While the output of the AND gate 502 is at a low logic level (e.g., before a loss of power), the control 1 signal may be at a high logic level due to the inverted input of the AND gate 504 coupled to the output of the AND gate 502. However, upon loss of power and the transition of the output of the AND gate 502, the control 1 signal, the output of the AND gate 504, may transition to a low logic level. Due to the control 1 signal transitioning low, the switch SW 2 may open to disconnect the source, bulk, and drain nodes of the transistor 402 from the positive global supply. Concurrently, the logic level high output of the AND gate 502 provided to the OR gate 506 may cause the output of the OR gate 506 to transition to high. The output of the OR gate 506, the control 2 signal, may then cause the switch SW1 to open so that the gate node/access line is disconnected from the negative global supply. The switching of the two switches SW1 and SW2 may result in the charge sharing circuit and the transistor 402 being isolated from the positive and negative voltage supplies, which may result in charge equalization between the gate node and the bulk (e.g., the p-well and the deep n-well) of the transistor 402.

The high logic level of the output of the AND gate 502 provided to the OR gate 508 may also cause the output of the OR gate 508 to transition to a high logic level. The control 3 signal, the output of the OR gate 508, may be provided to the switch SW3 and the n-channel transistor 404, which may result in SW3 closing and the transistor 404 turning on (e.g., conducting) so that the circuit coupling the gate node and the source, bulk, drain nodes of the transistor 402 is enabled. Upon the charge sharing circuit 400 becoming enabled, the various nodes of the transistor 402 may be coupled together. The coupled nodes may then decay to zero due to the loss of power, which may reduce or eliminate the occurrence of the reverse bias across the p-n junction between the drain and the p-well of the transistor 402 due in part to equalization of the charge differences between the gate node and bulk node. In some embodiments, the charge sharing circuit 400 is configured to provide substantially simultaneous decay of the coupled nodes to zero to reduce severity of a reverse bias condition responsive to the loss of power, and thereby limit damage that may occur otherwise.

The detection of a power loss during an erase operation, which may be the result of the control circuit 500 monitoring the occurrence of the condition, may reduce or eliminate the possibility of damage to the transistors of the access line voltage generator 102, for example. The enablement of the charge sharing circuit may allow the various charges (e.g., voltages) applied to the nodes of the transistor to dissipate through a more favorable circuit than through coupling internally through the transistor, thereby averting damage.

Figure 5B:
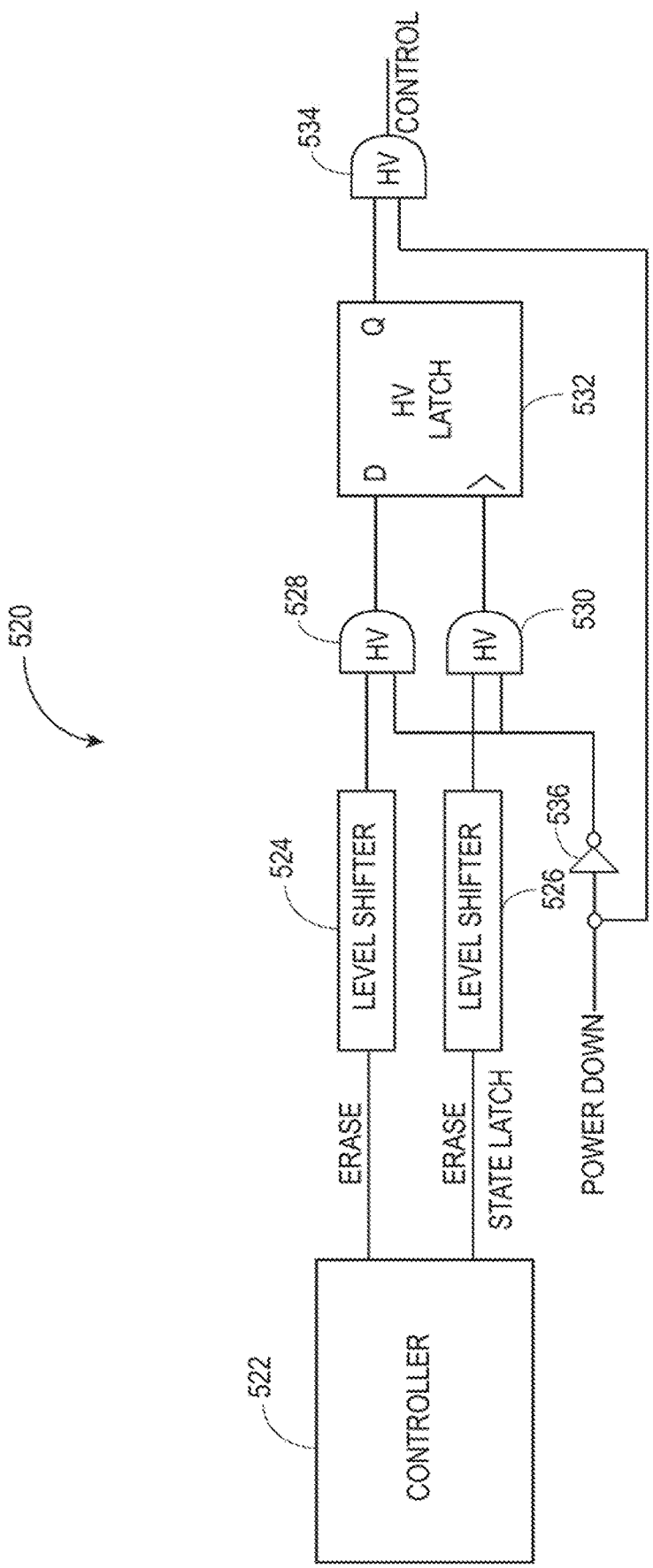
FIG. 5B is an example of a high voltage control circuit in accordance with an embodiment of the present disclosure.

FIG. 5B is an example of a high voltage control circuit 520 in accordance with an embodiment of the present disclosure. The high voltage control circuit 520, which may simply be referred to as the control circuit 520, may be configured to control a charge sharing circuit, such as the charge sharing circuit 420 of FIG. 4B. The control circuit 520 may be high voltage logic, which may be powered for a longer amount of time, as compared to low voltage circuits, in the event power is lost. This longer operating period in the event of a power loss may be due to the high voltage control circuit 520 being powered by charge pumps. This may provide a more robust and reliable control of a charge sharing circuit, for example. The control circuit 520 may monitor for the occurrence of a condition, such as power loss after high negative and positive voltages are applied to a block of memory array cells, such as for an erase or program operation. Based on the occurrence of the condition, the control circuit 520 may provide control signals to a charge sharing circuit in order to establish a charge sharing path and to decouple global power supply voltages from the memory array and at least an access line voltage generator, for example.

The control circuit 520 may include a controller 522, level shifters 524 and 526, HV AND gates 528, 530, and 534, and a HV latch 532. An inverter 536 may also be included. The controller 522 may be an internal memory controller and may provide signals indicating a current mode of operation of the memory device, an erase operation for example. The signals provided by the controller 522 may include an erase signal and an erase state latch signal. The erase signal may be provided when the memory is performing an erase operation and the erase state latch signal may be provided so that the HV latch 532 latches the erase signal. The level shifters may first receive the erase and erase state latch signals and, in response, increase a voltage level of the signals. The higher voltage signals may then be provided to one input of the HV AND gates 528 and 530, respectively. A power down signal, which may be provided by an external controller or a host, may be inverted by the inverter 536 then provided to another input of the HV AND gates 528 and 530. An output of the HV AND gate 528 may be provided to an input of the HV latch 532 and a timing input of the HV latch 532 may receive the output of the HV AND gate 530. An output of the HV latch 532 and the power down signal may be provided to the HV AND gate 534, an output of which provides a control signal. The control signal, for example, may be provided to the charge sharing circuit 420 for controlling the switches SW 4, 5, and 6.

In operation, the controller 522 may provide the erase signal and the erase state latch signal, which may be at a high logic level for example, to indicate an erase operation is being performed by a memory device that includes the control circuit 520. The higher voltage erase and erase state latch signals may then be provided to the HV AND gates 528 and 530, respectively. While power is supplied to the memory device that includes the control circuit 520, the power down signal may be at a low logic level, for example. As such, an output of the inverter 536 may provide an inverted power down signal, at a high logic level for example, to the HV AND gates 528 and 530. While both inputs of the HV AND gates 528 and 530 are at a high logic level, then the outputs of the HV AND gates 528 and 530 may also be at a high logic level, which may cause the HV latch 532 to latch the state of the erase signal. The latched state of the erase signal, which may be at a high logic level, may then be provided to the HV AND gate 534. The output of the HV AND gate 534 may then be determined by the state of the power down signal.

While the power down signal is at a low logic state, which may indicate that power is present, the output of the HV AND gate 534 may be low. A low output by the HV AND gate 534 may not cause the charge sharing circuit 420 to be enabled. For example, a low output of the HV AND gate 534 may not cause switch SW4 to close and switches SW 5 and 6 to open. As such, the global supplies may remain coupled to the memory and the charge sharing path may not be established.

However, if the power down signal transitions to a high logic state, which may indicate that power is no longer present, the output of the HV AND gate 534 may transition to a high logic level. A high output by the HV AND gate 534 may cause the charge sharing circuit 420 to be enabled and the global supplies to be decoupled from the memory. For example, a high output of the HV AND gate 534 may cause switch SW4 to close and switches SW 5 and 6 to open. As such, the global supplies may be decoupled from the memory and the charge sharing path may be established.

Figure 6:
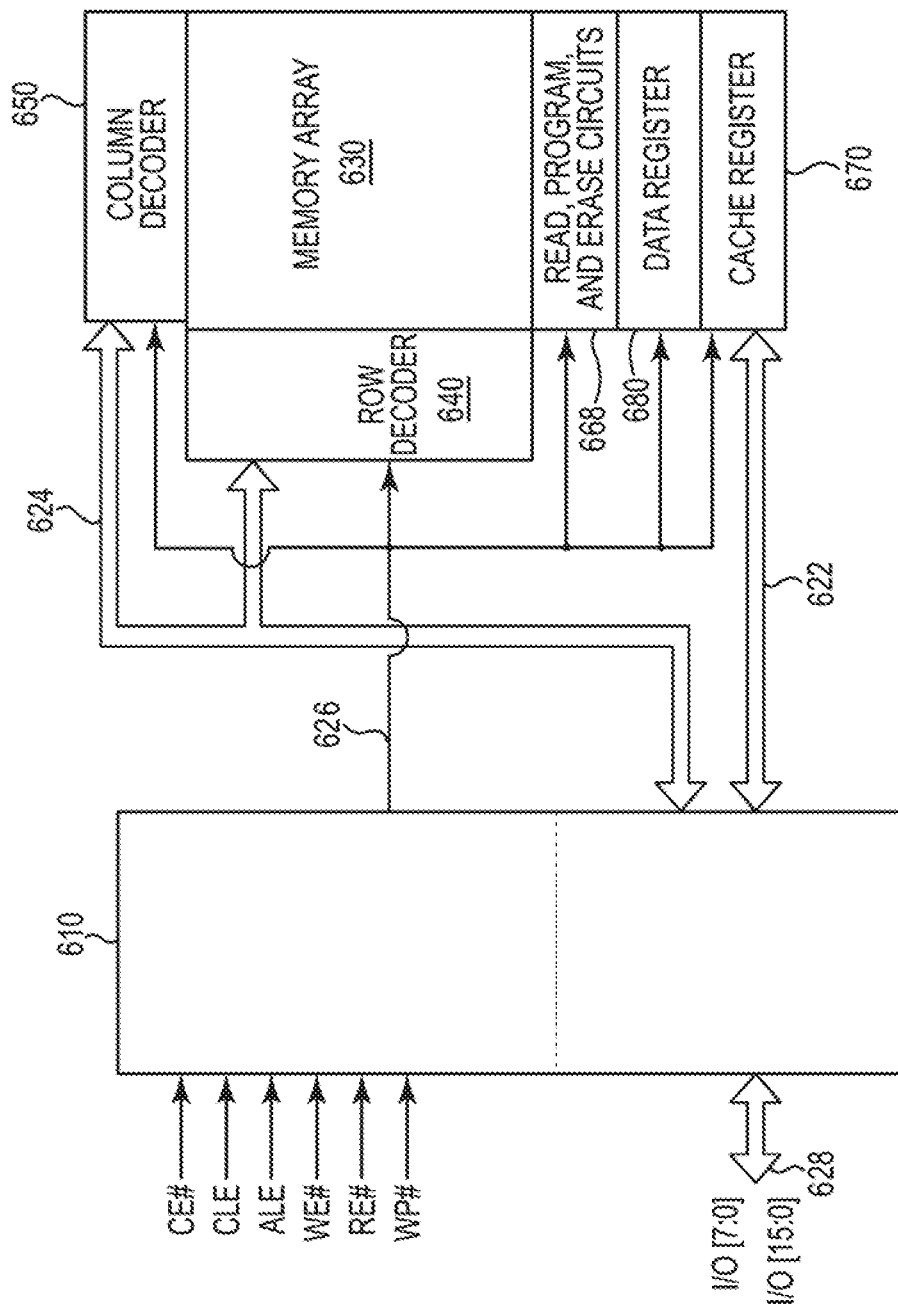
FIG. 6 illustrates a memory according to an embodiment of the present disclosure.

FIG. 6 illustrates a memory 600 according to an embodiment of the present disclosure. The memory 600 includes a memory array 630 with a plurality of memory cells. The memory cells may be non-volatile memory cells, such as floating gate memory cells, or may generally be any type of memory cells. The memory 600 may include the access line voltage generator 102 of FIG. 1, not shown in FIG. 6. In some examples, the memory array 630 may be divided into a plurality of memory planes.

Command signals, address signals and data signals may be provided to the memory 600 as sets of sequential and/or parallel input/output ("I/O") signals. Data signals may be transmitted through an I/O bus 628 The I/O bus 628 is connected to an I/O control unit 620 that routes the signals between the I/O bus 628 and an internal data bus 622, an internal address bus 624, and an internal command bus 626. The memory 600 also includes a control logic unit 610 that receives a number of control signals externally to control the operation of the memory 600. The combination of the control logic unit 610 and the I/O control unit 620 may facilitate memory access of the memory array 630.

The address bus 624 applies block-row address signals to a row decoder 640 and column address signals to a column decoder 650. The row decoder 640 and column decoder 650 may be used to select blocks of memory or memory cells for memory operations, for example, read, program, and erase operations. The column decoder 650 may enable data signals to be applied to columns of memory corresponding to the column address signals and allow data signals to be coupled from columns corresponding to the column address signals.

In response to the memory commands decoded by the control logic unit 610, the memory cells in the array 630 are read, programmed, or erased. Read, program, erase circuits 668 coupled to the memory array 630 receive control signals from the control logic unit 610 and include voltage generators for providing various voltages for read, program, and erase operations. In some examples, the read, program, erase circuits 668 may include access line voltage generator circuits that include a charge sharing circuit and corresponding control circuit to reduce potential damages to the access line voltage generator circuits due to the occurrence of an unwanted condition, power loss during an erase operation for example. The control circuit may monitor for the occurrence of the unwanted condition and, upon detection of the condition, may enable the charge sharing circuit and disconnect transistors from voltage sources to reduce or eliminate a large reverse bias occurring across an internal p-n junction of the transistors. The reduction of the reverse bias or its elimination may prevent the p-n junction from physical damage.

After the row address signals have been applied to the address bus 624, the I/O control unit 620 routes data signals to a cache register 670 for a program operation. The data signals are stored in the cache register 670 in successive sets each having a size corresponding to the width of the I/O bus 628. The cache register 670 sequentially stores the sets of data signals for an entire row or page of memory cells in the array 630. All of the stored data signals are then used to program a row or page of memory cells in the array 630 selected by the block-row address coupled through the address bus 624. In a similar manner, during a read operation, data signals from a row or block of memory cells selected by the block-row address coupled through the address bus 624 are stored in a data register 680. Sets of data signals corresponding in size to the width of the I/O bus 628 are then sequentially transferred through the I/O control unit 620 from the cache register 670 to the I/O bus 628.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus comprising:
   a memory array;
   a control circuit configured to receive a plurality of signals indicative of an operation being performed on the memory array, the control circuit further configured to monitor the plurality of signals for an occurrence of a condition; and
   a charge sharing circuit configured to receive a plurality of controls signals from the control circuit and further configured to activate a charge sharing path between first and second voltages, wherein a control signal of the plurality of control signals is indicative of coupling a gate node and a bulk node of a transistor.

2. The apparatus of claim 1, further comprising:
   an access line voltage generator coupled to the memory array via an access line driver, the access line voltage generator comprising a transistor, the transistor comprising the gate node and a bulk node.

3. An apparatus comprising:
   a memory array;
   a control circuit configured to receive a plurality of signals indicative of an operation being performed on the memory array, the control circuit further configured to monitor the plurality of signals for an occurrence of a condition;
   a charge sharing circuit configured to receive a plurality of controls signals from the conrol circuit and further configured to activate a charge sharing path between first and second voltages; and
   an access line voltage generator coupled to the memory array via an access line driver, the access line voltage generator comprising a transistor, the transistor comprising a gate node and a bulk node, wherein the plurality of controls signals are indicative of coupling the gate node and the bulk node of the transistor and de-coupling the gate node and the bulk node from the first and second voltages, respectively.

4. The apparatus of claim 1, wherein the control circuit comprises an AND gate configured to combine at least two signals of the plurality of signals and further configured to provide the control signal of the plurality of controls signals to the charge sharing circuit, the control signal based on the combination of the at least two signals of the plurality of signals.

5. The apparatus of claim 4, wherein the at least two signals of the plurality of signals comprise a power down signal and an erase signal.

6. The apparatus of claim 4, wherein the control signal is indicative of disconnecting a node of a transistor from the second voltage.

7. The apparatus of claim 6, wherein the control signal is indicative of disconnecting an additional of the transistor from the first voltage.

8. The apparatus of claim 4, wherein the control signal is configured to activate the first and second switches of the charge sharing circuit, to deactivate the first and second voltages, respectively.

9. A method, comprising:
   receiving a plurality of signals, the plurality of signals indicative of an operation being performed on a memory;
   monitoring the plurality of signals for an occurrence of a condition; and
   responsive to the occurrence of the condition, providing a plurality of control signals to a charge sharing circuit, wherein a control signal of the plurality of control signals is indicative of coupling a gate node and a bulk node of a transistor.

10. A method, comprising:
    receiving a plurality of signals, the plurality of signals indicative of an operation being performed on a memory;
    monitoring the plurality of signals for an occurrence of a condition; and
    responsive to the occurrence of the condition, providing a plurality of control signals to a charge sharing circuit, wherein the plurality of signals comprises a power down signal, an erase mode signal, a charge share circuit enable signal, an access line connect/disconnect signal, and a source/bulk/drain connect/disconnect signal.

11. A method, comprising:
    receiving a plurality of signals, the plurality of signals indicative of an operation being performed on a memory;

monitoring the plurality of signals for an occurrence of a condition;

responsive to the occurrence of the condition, providing a plurality of control signals to a charge sharing circuit; and coupling a gate node and a bulk ode of a transistor and de-coupling the gate node and the bulk node from the first and second voltages, respectively.

12. The method of claim 11, wherein the plurality of controls signals are indicative of coupling the gate node and the bulk node of the transistor and de-coupling the gate node and the bulk node from first and second voltages, respectively.

13. The method of claim 9, wherein monitoring the plurality of signals for the occurrence of the condition comprises:

combining, at an AND gate, at least two signals of the plurality of signals to provide a control signal of the plurality of controls signals to the charge sharing circuit.

14. A method comprising:

receiving a plurality of signals, the plurality of signals indicative of an operation being performed on a memory;

monitoring the plurality of signals for an occurrence of a condition, wherein monitoring the plurality of signals for the occurrence of the condition comprises:

combining, at an AND gate, at least two signals of the plurality of signals to provide a control signal of a plurality of controls signals to the charge sharing circuit; and responsive to the occurrence of the condition, providing the plurality of control signals to a charge sharing circuit, wherein the control signal is indicative of disconnecting a bulk node of a transistor from a positive voltage.

15. The method of claim 13, wherein the control signal is indicative of disconnecting a gate node of a transistor from a negative voltage.

16. A method, comprising:

receiving a plurality of signals indicative of an operational mode;

detecting an occurrence of a condition based on the plurality of signals;

providing at least one control signal to a charge sharing circuit based at least on the occurrence of the condition detected, wherein the at least one control signal is indicative of coupling a gate node and a bulk node of a transistor.

17. The method claim 16, wherein the operational mode is an erase operation on a memory.

18. The method claim 16, wherein the occurrence of the condition comprises a change to a characteristic of the operational mode.

19. The method claim 18, wherein the characteristic of the operational mode comprises at least one of an unplanned/undesired voltage/current occurrence, a power loss, a voltage spike, or a voltage/current transient.

* * * * *

UNITED STATES PATENT AND TRADEMARK OFFICE
CERTIFICATE OF CORRECTION

PATENT NO. : 10,811,101 B2  
APPLICATION NO. : 16/537345  
DATED : October 20, 2020  
INVENTOR(S) : Yafeng Zhang et al.

Page 1 of 1

It is certified that error appears in the above-identified patent and that said Letters Patent is hereby corrected as shown below:

In the Claims

Column 11, Line 58 reads "of controls signals" should read --of control signals--

Column 12, Line 16 reads "of controls signals" should read --of control signals--

Column 12, Line 23 reads "of controls signals" should read --of control signals--

Column 12, Line 34 reads "an additional of the" should read --an additional node of the--

Column 13, Line 6 reads "a bulk ode of a" should read --a bulk node of a--

Column 13, Lines 10, 18 & 29 reads "of controls signals" should read --of control signals--

Signed and Sealed this  
First Day of December, 2020

Andrei Iancu  
*Director of the United States Patent and Trademark Office*